United States Patent
Cheek et al.

(10) Patent No.: US 6,638,829 B1
(45) Date of Patent: Oct. 28, 2003

(54) SEMICONDUCTOR STRUCTURE HAVING A METAL GATE ELECTRODE AND ELEVATED SALICIDED SOURCE/DRAIN REGIONS AND A METHOD FOR MANUFACTURE

(75) Inventors: Jon Cheek, Round Rock, TX (US); Derick Wristers, Austin, TX (US); Mark I. Gardner, Cedar Creek, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/199,960

(22) Filed: Nov. 25, 1998

(51) Int. Cl.⁷ .................. H01L 21/336; H01L 21/3205; H01L 21/4763
(52) U.S. Cl. ........................ 438/300; 438/585; 438/587; 438/595
(58) Field of Search .................. 438/299, 300–307, 438/656, 674, 675, 685–688, 585, 587, 595; 257/382, 384, 388, 407, 900, 412, 408

(56) References Cited

U.S. PATENT DOCUMENTS 5,168,072 A * 12/1992 Moslehi .................... 437/41
5,198,378 A * 3/1993 Rodder et al. ............. 437/41

OTHER PUBLICATIONS

A. Chatterjee et al. "Sub–100nm Gate Length Metal Gates NMOS Transistors Fabricated by a Replacement Gate Process", IEDM, pp. 821–824, Dec. 1997.*

Stanley Wolf, Silicon Processing for the VLSI Era, Vo. 2: Process Integration, pp. 144–151, 157–158, 1990.*

R. D. Butler, "MOS Fabrication Process Integrating Self–Aligned Polysilicon Gate and Post–Processed Metal Gate Devices on a Single Die" University/Government/Industry Microelectronics Symposium, pp. 199–203, Jun. 1991.*

* cited by examiner

Primary Examiner—Erik Kielin

(57) ABSTRACT

A semiconductor structure and a process for its manufacture. A metal gate electrode is formed on a semiconductor substrate, the gate electrode being between nitride spacers. Lightly-doped drain regions and source/drain regions are disposed in the substrate and aligned with the electrode and spacers. A silicide contact layer is disposed over an epitaxial layer on the substrate over the source/drain regions.

8 Claims, 3 Drawing Sheets

SEMICONDUCTOR STRUCTURE HAVING A METAL GATE ELECTRODE AND ELEVATED SALICIDED SOURCE/DRAIN REGIONS AND A METHOD FOR MANUFACTURE

FIELD OF THE INVENTION

The present invention is directed generally to semiconductor structures and, more particularly, to a metal gate electrode formed in combination with elevated salicided source/drain regions.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applicability and numerous disciplines. One such silicon-based semiconductor device is a metal-oxide-semiconductor (MOS) transistor.

A typical MOS semiconductor device generally includes a gate electrode, which acts as a conductor, to which an input signal is typically applied via a gate terminal. Heavily doped source/drain regions are formed in a semiconductor substrate and are respectively connected to source and drain terminals. A channel region is formed in the semiconductor substrate beneath the gate electrode and separates the source/drain regions. The channel is typically lightly doped with a dopant type opposite that of the source/drain regions. The gate electrode is physically separated from the semiconductor substrate by a gate insulating layer, typically an oxide layer such as $SiO_2$. The insulating layer is provided to prevent current from flowing between the gate electrode and the source/drain regions or channel region.

In operation, an output voltage is typically developed between the source and drain terminals. When an input voltage is applied to the gate electrode, a transverse electric field is set up in the channel region. By varying the transverse electric field, it is possible to modulate the conductance of the channel region between the source region/drain regions. In this manner an electric field controls the current flow through the channel region. This type of device is commonly referred to as a MOS field-effect transistor (MOSFET).

Semiconductor devices, like the one described above, are used in large numbers to construct most modern electronic devices. In order to increase the capability of such electronic devices, it is necessary to integrate ever increasing numbers of such devices into a single silicon wafer. As the semiconductor devices are scaled down (i.e., made smaller) and in order to form a larger number of devices on a given surface area, the structure of the devices and fabrication techniques used to make such devices must be altered.

Several objectives influence MOSFET design and fabrication. First, there is a desire to reduce the dimensions of the MOSFET. Increasing the number of individual MOSFETs that can be placed onto a single silicon chip or die produces increased functionality per chip. Second, there is a continual desire to improve performance, and particularly the speed, of the MOSFET transistors. This pursuit is manifested in shorter conduction channel lengths and in efforts to obtain low contact resistivity at the MOSFET junctions. These aspects offer increased MOSFET speed and allow for a greater number of operations to be performed by the MOS-FET in less time. MOSFETs are used in great quantity in computers where the push to obtain higher operation cycle speeds demands faster MOSFET performance. Lastly, there exists a constant need to minimize costly MOSFET fabrication steps.

Many prior MOSFETs designs have metal gate electrodes. However, with the challenges that accompany submicron gate alignment and modern high-temperature processing, metal gate electrodes have often been replaced with polysilicon gate electrodes. One difficulty faced in making semiconductor structures having metal gates is that the melting point of the metal is below the temperatures applied to the structure during high temperature thermal annealing which is used for various purposes during fabrication. Polysilicon, in contrast, has a much higher melting point. Thus, polysilicon is often used for gate electrodes. However, metal is desirable because of its conductivity and its ability to produce a stronger electric field.

Conventional approaches have encountered difficulty trying to maintain performance in the face of decreasing size and increasing density of devices. In attempting to overcome these hurdles, it is equally desirable to keep costly processing steps to a minimum. Therefore, it is desirable to provide a semiconductor structure and provide a process for its manufacture to address the above identified problems.

SUMMARY OF THE INVENTION

Generally, the present invention relates to a semiconductor structure and a process for its manufacture. In one embodiment, a semiconductor structure is provided. The semiconductor structure comprises a metal gate electrode formed on a semiconductor substrate, the gate electrode being between nitride spacers. Lightly-doped drain regions and source/drain regions are disposed in the substrate and aligned with the electrode and spacers. A silicide contact layer is disposed over an epitaxial layer on the substrate over the source/drain regions.

In another embodiment, a process is provided for manufacturing a semiconductor structure. The process comprises forming a polysilicon alignment structure on a semiconductor substrate. A first concentration of a first dopant species is implanted at a first energy level into the substrate, whereby lightly doped drain regions are formed in the substrate and aligned with the alignment structure. Nitride spacers are formed on sides of the alignment structure, and a second dopant species is implanted into the substrate at a second energy level and a second concentration, whereby source and drain regions are formed in the substrate and aligned with the alignment structure. An epitaxial layer is grown on the substrate adjacent to the spacers, and the polysilicon alignment structure is removed, thereby forming a trench between the spacers. A gate dielectric is formed in the trench, and a silicide layer is formed on the epitaxial layer. Lastly, a metal gate electrode is formed in the trench.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
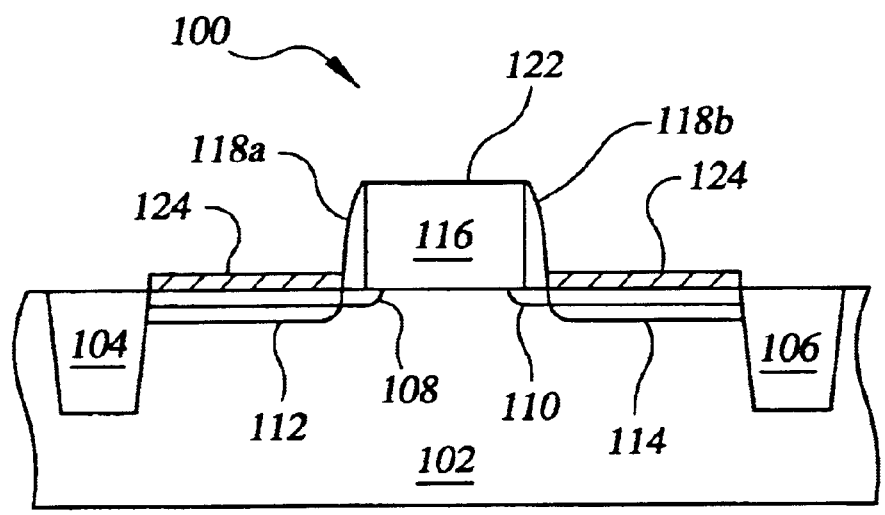
FIG. 1 is a partial cross-sectional view of an example semiconductor structure including a substrate 102 upon which isolation trenches, LDD implants, and source/drain regions have been formed.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of semiconductor transistor arrangements. The invention has been found to be particularly advantageous in applications where trench isolation is desirable, such as in PMOS, NMOS, CMOS, and BiCMOS devices. While the present invention is not so limited, an appreciation of various aspects of the invention is best gained through a discussion of various application examples of processes used to form such semiconductor devices.

The invention has as one example aspect, the formation of a metal gate electrode in a semiconductor structure. One difficulty faced in making semiconductor structures having metal gates is that the melting point of the metal is below the temperatures applied to the structure during thermal annealing of the implants and in making silicide contact layers. Polysilicon, in contrast, has a much higher melting point. Thus, polysilicon is often used for gate electrodes. Metal is desirable because of its conductivity and its ability to produce a stronger electric field.

FIGS. 1–4 illustrate semiconductor structures at various stages in a process flow in accordance with example embodiments of the invention. FIG. 1 is a partial cross-sectional view of an example semiconductor structure 100 including a substrate 102 upon which isolation trenches 104 and 106, LDD implants 108 and 110, and source/drain regions 112 and 114 have been formed. In an example CMOS embodiment, the substrate 102 is a p+ silicon bulk which incorporates p-well and n-well regions. The well formation process is suitably accomplished by implanting selected impurity distributions into the appropriate well regions in conjunction with conventional masking steps. For example, for p-well regions ions of boron are implanted, and for n-well regions ions of phosphorous are implanted.

The structure 100 also includes a polysilicon region 116 and spacers 118a and 118b. The polysilicon region 116 and spacers 118a–b are used in aligning the lightly-doped drain (LDD) regions 108 and 110 and source/drain regions 112 and 114, and in creating a trench for a subsequently deposited metal gate electrode. Polysilicon is used in the formation of the implant regions 108–114 because it is not susceptible to damage from high temperatures during rapid thermal annealing (RTA). The structure 100 is formed in accordance with the following example process sequence.

A photo-resist mask pattern (not shown) is formed on the substrate 102 to pattern the trenches 104 and 106. The trenches 104 and 106 are then formed by etching the silicon substrate 102 to a desired depth using a plasma anisotropic etch process in which the plasma contains fluorine or chlorine. The photo-resist material is then stripped, and the resulting trenches 104 and 106 are filled in accordance with conventional processes. It will be appreciated that both shallow trench isolation and LOCOS isolation are compatible with the present invention.

After the trenches 104 and 106 are formed and filled, a layer (not shown) of polysilicon is deposited on the substrate 102. The deposition is accomplished by blanket depositing polysilicon in a chemical vapor deposition process. Because the polysilicon is used only for alignment of a metal gate to be subsequently deposited, doping the polysilicon is unnecessary. A photo-resist mask pattern (not shown) is formed over the polysilicon layer to pattern the polysilicon region 116. The polysilicon is then etched, leaving region 116, and the photo-resist material is stripped.

After the polysilicon region 116 is formed, the LDD regions 108 and 110 are formed implanting ions having a concentration in the range of approximately 8E14 to 3E15 ions/$cm^2$, and the implant energy in the range of approximately 0.5 keV to 5 keV. The first dopant species may be ions of boron, phosphorus, or arsenic, for example. The LDD implant regions 108 and 110 are aligned with the polysilicon region 116.

Following the LDD implant, the LDD regions are activated with an RTA. For example, the RTA may involve temperatures in the range of approximately 950°–1060° C. applied for a period of approximately 6–30 seconds. It will be appreciated that the polysilicon region 116 is not adversely affected by the temperatures of the RTA, whereas if metal were present, it would melt or evaporate.

The spacers 118a–b are nitride and are formed following the LDD implant. In a first stage, spacer material is deposited over the entire semiconductor structure. The spacer material is then removed using, for example, an anisotropic etch, leaving spacers 118a–b.

After formation of the spacers 118a–b, the source/drain regions 112 and 114 are implanted in alignment therewith. The dopant species used to form the source drain regions may be ions of boron, phosphorus, or arsenic, for example, implanted at an energy level that ranges from approximately 5 keV to 60 keV and an ion concentration of approximately 2E15–6 E15 ions/$cm^2$.

Following the source/drain implant, the source/drain regions 112 and 114 are activated with an RTA. For example, the RTA may involve temperatures in the range of approximately 950°–1060° C. applied for a period of approximately 6 to 30 seconds.

An epitaxial layer 124, for example 100–200 Å thick, is selectively grown on the substrate 102, whereby silicon is grown only on the crystalline silicon. That is, the epitaxial layer is not grown over the trenches 104 and 106, nor is it grown over the polysilicon region 116. A silicide sequence, which consumes silicon, is used later in the process described herein. Thus, the thickness of the epitaxial layer 124 depends upon the thickness of silicon consumed in the silicide sequence.

Figure 2:
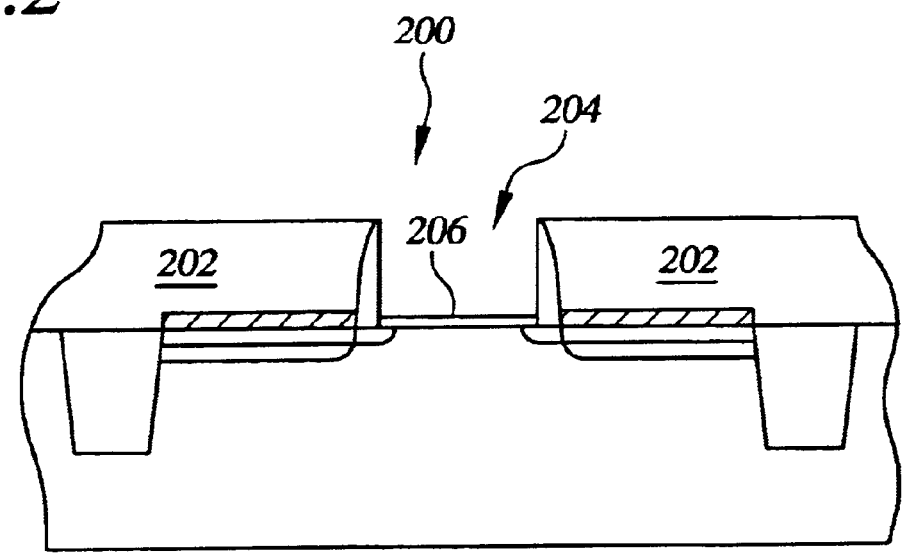
FIG. 2 is a partial cross-sectional view of a semiconductor structure after having deposited a layer of oxide and removed the polysilicon region.

FIG. 2 is a partial cross-sectional view of a semiconductor structure 200 after having deposited a layer 202 of oxide and removed the polysilicon region 116 of FIG. 1. Following the process sequence described in conjunction with FIG. 1, a layer of oxide 202 is deposited on the substrate 102 and over the polysilicon region 116 (FIG. 1), and the oxide layer is planarized with the upper surface 122 (FIG. 1) of the polysilicon region. The polysilicon region 116 is etched, for example, using a plasma anisotropic etch or a wet etch that is highly selective to polysilicon. Removal of the polysilicon leaves trench 204 which is aligned with the LDD regions 108 and 110 and the source/drain regions 112 and 114.

A gate oxide, for example, is grown at the base of the trench 204 to an implementation selected depth. The gate oxide forms the gate dielectric layer 206.

Figure 3A:
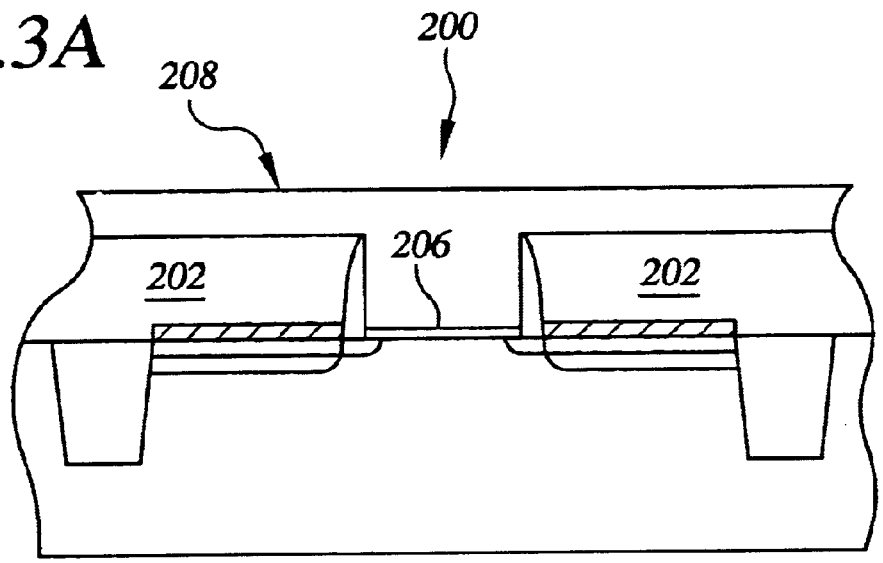
FIGS. 3A–3C are cross sectional view of a semiconductor structure having another oxide layer formed in the gate trench and a $TiSi_2$ layer formed over the source/drain regions.
Figure 3B:
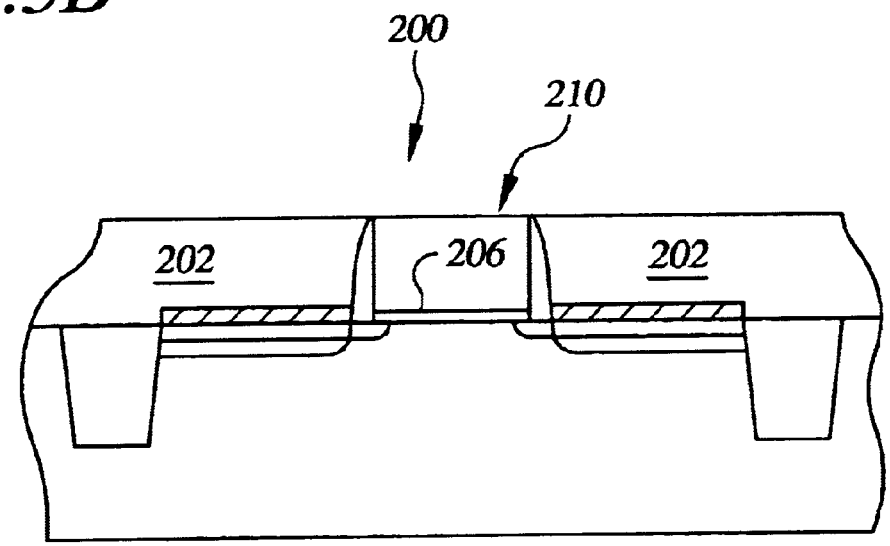
Figure 3C:
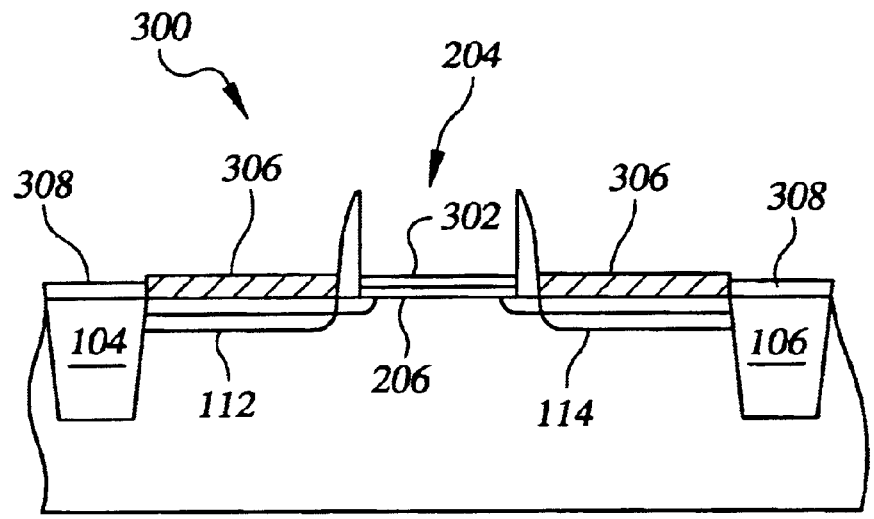

FIGS. 3A–3C are cross sectional views of a semiconductor structure having another oxide layer 302 formed in the gate trench 204 and a silicide layer formed over the source/drain regions 112 and 114. In making the structure 300 of FIG. 3C, a layer of oxide 208 (FIG. 3A) is first deposited over the structure 200 shown in FIG. 2 and planarized with the layer 202 (layer 210; FIG. 3B) thereby filling the gate trench 204 (FIG. 2) with oxide. Then, the oxide layer (202 of FIG. 2 and the oxide in the gate trench 204) is etched, leaving a second oxide layer 302 in the trench and an oxide layer 308 over the isolation trenches 104 and 106. While not shown to scale, in an example embodiment, the second layer 302 is approximately 200–500 Å thick.

After the oxide layers 302 and 308 are formed, a silicide metal, for example, Ti, is blanket deposited in the trench 204 and over the epitaxial layer 124 and oxide layer 308 using conventional processes. An example thickness of the deposited Ti is 800 Å. The resultant structure is then subjected to a rapid thermal anneal to react the Ti with silicon in order to form the $TiSi_2$ layer 306. For example, the RTA may involve temperatures in the range of approximately 600°–800° C. applied for a period of approximately 10 to 60 seconds.

After the RTA, the unreacted Ti is removed with a conventional Ti etch process. That is, the Ti etch is selective to the $TiSi_2$ layer 306, which as shown in structure 300, remains after the etch. In other embodiments, metals such as cobalt or nickel could be used in making the silicide layers.

Figure 4:
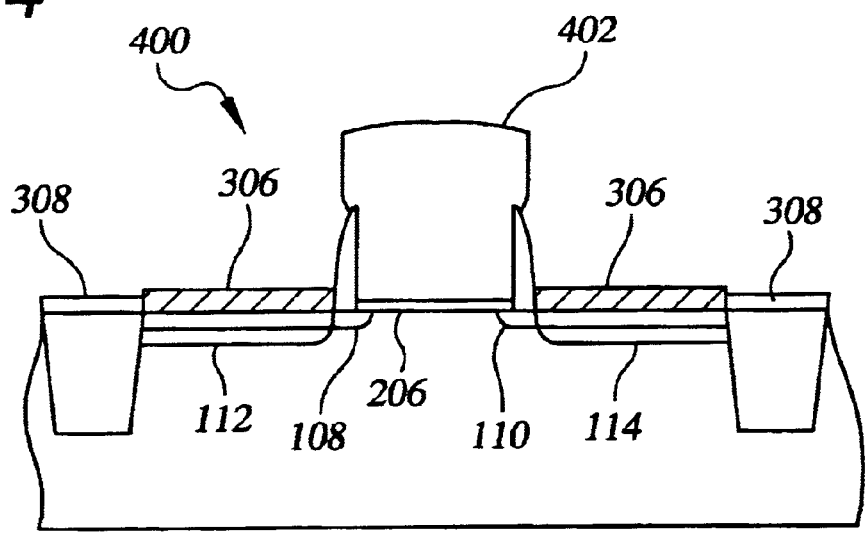
FIG. 4 is a partial cross-sectional view of a semiconductor structure with a metal gate electrode, in accordance with an example embodiment of the invention.

FIG. 4 is a partial cross-sectional view of a semiconductor structure 400 with a metal gate electrode 402, in accordance with an example embodiment of the invention. In making the structure 400, the oxide layer 302 (FIG. 3C) is first removed using an oxide etch. It will be appreciated that the oxide layer 302 functions as a protective barrier between the high quality gate oxide 206 and the Ti layer which was used in making the $TiSi_2$ layer 306. When subjected to the RTA described above in reference to FIG. 3C, the oxide layer 302 protects the gate oxide layer 206 from reacting with the Ti. It will be appreciated that with the removal of the oxide layer 302 (FIG. 3C), the oxide layers 308 will be reduced in thickness.

After the oxide has been etched, a tungsten layer (not shown) is deposited for formation of the gate electrode 402. The tungsten layer is then masked and etched using conventional techniques. It will be appreciated that other metals, for example, aluminum or titanium could be used instead of tungsten.

Standard processing techniques are then used to complete formation of an integrated circuit. For example, an interlevel dielectric layer is deposited, source and drain contacts are formed, and transistor interconnections are formed.

It will be appreciated that the structure 400 includes the $TiSi_2$ layer 306 over the source/drain regions 112 and 114, along with a metal gate electrode. The $TiSi_2$ layer 306 promotes the formation of shallow junctions and low-ohmic contacts in the source/drain regions in the final device, and the metal gate electrode is desirable because of its conductivity and its ability to produce a stronger electric field.

As noted above, the present invention is applicable to fabrication of a number of different devices. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art upon review of the present specification. The claims are intended to cover such modifications and devices.

We claim:

1. A process for making a semiconductor structure with a silicon substrate, comprising:

forming a polysilicon alignment structure on the substrate;

implanting into the substrate at a first energy level a first concentration of a first dopant species, whereby lightly doped drain regions are formed in the substrate and aligned with the alignment structure;

forming nitride spacers on sides of the alignment structure;

implanting into the substrate at a second energy level a second concentration of a second dopant species, whereby source and drain regions are formed in the substrate and aligned with the alignment structure;

growing an epitaxial layer on the substrate adjacent to the spacers;

removing the polysilicon alignment structure, thereby forming a trench between the spacers;

forming a gate dielectric which is an oxide growth, in the trench;

depositing an oxide layer over the gate dielectric, nitride spacers and epitaxial layer;

planarizing the oxide layer to be level with the nitride spacers;

etching the oxide layer prior to forming the silicide layer;

forming a silicide layer on the epitaxial layer; and forming a metal gate electrode in the trench, wherein the top of the gate electrode is disposed only over the lightly doped drain regions.

2. The process of claim 1, further comprising:

wherein etching the oxide layer leaves a protective oxide layer in the trench, whereby the gate dielectric is protected during formation of the silicide layer; and etching the protective oxide layer after forming the silicide layer.

3. The process of claim 2, wherein forming the metal gate electrode includes:

depositing a layer of a selected metal over the silicide layer and in the trench;

forming a mask pattern on the layer of the selected metal; and etching the layer of the selected metal.

4. A process for making a semiconductor structure with a silicon substrate, comprising:

forming a polysilicon alignment structure on the substrate;

implanting at a first energy level a first concentration of a first dopant species into the substrate, whereby lightly doped drain regions are formed in the substrate and aligned with the alignment structure;

forming nitride spacers on sides of the alignment structure;

implanting at a second energy level a second concentration of a second dopant species into the substrate, whereby source and drain regions are formed in the substrate and aligned with the alignment structure;

growing an epitaxial layer on the substrate adjacent to the spacers;

depositing a first oxide layer over the polysilicon alignment structure and epitaxial layer;

planarizing the oxide layer to be level with the polysilicon alignment structure;

removing the polysilicon alignment structure, thereby forming a trench between the spacers;

forming a gate dielectric in the trench;

depositing a second oxide layer over the first oxide layer and in the trench;

planarizing the second oxide layer with the spacers;

etching the first and second oxide layers leaving a selected thickness of the second oxide layer present in the trench;

depositing a first metal layer of a first selected metal on the epitaxial layer;

subjecting the first metal layer to a rapid thermal anneal, thereby forming a silicide layer;

etching the second oxide layer remaining in the trench; and forming a metal gate electrode in the trench, wherein the top of the gate electrode is disposed only over the lightly doped drain regions.

5. The process of claim 4, wherein the first metal layer is comprised of Ti.

6. The process of claim 5, wherein the metal gate electrode is comprised of W.

7. The process of claim 6, wherein the step of depositing a first metal layer includes depositing the metal layer on the second oxide layer present in the trench, whereby the second oxide layer will protect the gate dielectric during formation of the silicide layer.

8. The process of claim 7, wherein the step of forming the metal gate electrode includes:

depositing a layer of titanium over the silicide layer and in the trench;

forming a mask pattern on the layer of the titanium; and etching the layer of the titanium.

* * * * *